(12) United States Patent
Aoyama et al.

(10) Patent No.: US 7,989,896 B2
(45) Date of Patent: Aug. 2, 2011

(54) SEMICONDUCTOR DEVICE AND METHOD OF FABRICATING THE SAME

(75) Inventors: Tomonori Aoyama, Kanagawa (JP); Seiji Inumiya, Carmel, NY (US); Kazuaki Nakajima, Tokyo (JP); Takashi Shimizu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/612,238

(22) Filed: Nov. 4, 2009

(65) Prior Publication Data

US 2010/0133626 A1    Jun. 3, 2010

(30) Foreign Application Priority Data

Dec. 2, 2008   (JP) ................................. 2008-307865

(51) Int. Cl.
*H01L 27/11* (2006.01)
(52) U.S. Cl. ... 257/379; 257/294; 257/500; 257/E21.38; 257/E21.625; 257/E21.639
(58) Field of Classification Search .................. 438/218, 438/294; 257/379, 500, 341, E21.38, E21.625, 257/E21.639
See application file for complete search history.

(56) References Cited

U.S. PATENT DOCUMENTS

| 7,005,712 | B2 * | 2/2006 | Sato ............................. | 257/379 |
| 2003/0034531 | A1 * | 2/2003 | Kanda et al. .................. | 257/392 |
| 2009/0114996 | A1 | 5/2009 | Inumiya et al. | |
| 2009/0174013 | A1 | 7/2009 | Shimizu | |
| 2009/0194821 | A1 | 8/2009 | Kaneko et al. | |

OTHER PUBLICATIONS

Narayanan, et al., "Band-Edge High-Performance High-κ/Metal Gate n-MOSFETs using Cap Layers Containing Group IIA and IIIB Elements with Gate-First Processing for 45 nm and Beyond", 2006 Symposium on VLSI Technology Digest of Technical Papers, pp. 224-225, (Jun. 2006).
Yamamoto, et al., "Study of La Concentration Dependent $V_{FB}$ Shift in Metal/HfLaOx/Si Capacitors", Extended Abstracts of the 2006 International Conference on Solid State Devices and Materials, pp. 212-213, (Sep. 2006).
Kubicek, et al., "Strain enhanced Low-$V_T$ CMOS featuring La/Al-doped HfSiO/TaC and 10ps Invertor Delay", 2008 Symposium on VLSI Technology Digest of Technical Papers, pp. 130-131, (Jun. 2008).
Sekine, et al., "Extended Abstract", The $67^{th}$ Autumn Meeting, The Japan Society of Applied Physics, p. 716, (2006).

* cited by examiner

*Primary Examiner* — Long K Tran
(74) *Attorney, Agent, or Firm* — Finnegan, Henderson, Farabow, Garrett & Dunner, L.L.P.

(57) ABSTRACT

A method of fabricating a semiconductor device according to one embodiment includes: laying out a first region, a second region, a third region and a fourth region on a semiconductor substrate by forming an element isolation region in the semiconductor substrate; forming a first insulating film on the first region and the second region; forming a first semiconductor film on the first insulating film; forming a second insulating film and an aluminum oxide film thereon on the fourth region after forming of the first semiconductor film; forming a third insulating film and a lanthanum oxide film thereon on the third region after forming of the first semiconductor film; forming a high dielectric constant film on the aluminum oxide film and the lanthanum oxide film; forming a metal film on the high dielectric constant film; forming a second semiconductor film on the first semiconductor film and the metal film; and patterning the first insulating film, the first semiconductor film, the second insulating film, the aluminum oxide film, the third insulating film, the lanthanum oxide film, the high dielectric constant film, the metal film and the second semiconductor film.

8 Claims, 5 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2008-307865, filed on Dec. 2, 2008, the entire contents of which are incorporated herein by reference.

BACKGROUND

In late years, a fabricating method of a MOSFET (Metal Oxide Semiconductor Field Effect Transistor) using a film made of a high dielectric constant material as a gate dielectric film is suggested. According to the method, the physical film thickness of the gate dielectric film is increased to suppress generation of gate leakage current and the electric film thickness of the gate dielectric film is decreased. For example, Hf compound such as $HfO_2$ or Zr compound such as $ZrO_2$ is used for the high dielectric constant material.

In addition, a technique to cap upper surface of high dielectric constant gate dielectric film made of $HfO_2$ with a $La_2O_3$ film to decrease threshold voltage of an N-type MOSFET is known. The technique, for example, is disclosed in a non-patent literary document of V. Narayanan et al., 2006 Symposium On VLSI Technology Digest of Technical Papers, pp. 224-5.

Furthermore, a technique to cap upper surface of high dielectric constant gate dielectric film made of HfSiON with an $Al_2O_3$ film to decrease threshold voltage of a P-type MOSFET is known. The technique, for example, is disclosed in a non-patent literary document of K. Sekine et al., Extended Abstract (The 67$^{th}$ Autumn Meeting, 2006); The Japan Society of Applied Physics, p. 716.

Moreover, it is known that existence of La between an interface dielectric layer made of $SiO_2$ or SiON, which is formed on a channel region, and a high dielectric constant gate dielectric film made of Hf compound such as $HfO_2$ or HfSiON is needed. This, for example, is disclosed in a non-patent literary document of Y. Yamamoto et al., Extended Abstracts of the 2006 International Conference on Solid State Devices and Materials, pp. 212-3.

BRIEF SUMMARY

A method of fabricating a semiconductor device according to one embodiment includes: laying out a first region, a second region, a third region and a fourth region on a semiconductor substrate by forming an element isolation region in the semiconductor substrate; forming a first insulating film on the first region and the second region; forming a first semiconductor film on the first insulating film; forming a second insulating film and an aluminum oxide film thereon on the fourth region after forming of the first semiconductor film; forming a third insulating film and a lanthanum oxide film thereon on the third region after forming of the first semiconductor film; forming a high dielectric constant film on the aluminum oxide film and the lanthanum oxide film; forming a metal film on the high dielectric constant film; forming a second semiconductor film on the first semiconductor film and the metal film; and patterning the first insulating film, the first semiconductor film, the second insulating film, the aluminum oxide film, the third insulating film, the lanthanum oxide film, the high dielectric constant film, the metal film and the second semiconductor film.

A method of fabricating a semiconductor device according to another embodiment includes: laying out a first region, a second region, a third region and a fourth region on a semiconductor substrate by forming an element isolation region in the semiconductor substrate; forming a first insulating film on the first region, the second region and a fifth region, the fifth region being on the element isolation region; forming a first semiconductor film on the first insulating film; forming a second insulating film and an aluminum oxide film thereon on the fourth region after forming of the first semiconductor film; forming a third insulating film and a lanthanum oxide film thereon on the third region after forming of the first semiconductor film; forming a high dielectric constant film on the aluminum oxide film and the lanthanum oxide film; forming a metal film on the high dielectric constant film; forming a second semiconductor film on the first semiconductor film and the metal film; and patterning the first insulating film, the first semiconductor film, the second insulating film, the aluminum oxide film, the third insulating film, the lanthanum oxide film, the high dielectric constant film, the metal film and the second semiconductor film.

A semiconductor device according to another embodiment includes: a first N-type transistor formed on a semiconductor substrate, the first N-type transistor containing a first gate dielectric film and a first gate electrode; a first P-type transistor formed on the semiconductor substrate, the first P-type transistor containing a second gate dielectric film and a second gate electrode, the second gate dielectric film being made of the same material as the first gate dielectric film and having the same film thickness as the first gate dielectric film, the second gate electrode being made of the same material as the first gate electrode and having the same film thickness as the first gate electrode; a second N-type transistor formed on the semiconductor substrate, the second N-type transistor containing a third gate dielectric film and a third gate electrode, the third gate dielectric film consisting of a first insulator layer, a lanthanum oxide layer on the first insulator layer, and a first high dielectric constant insulator layer on the lanthanum oxide layer, the third gate electrode consisting of a first metal layer and a first semiconductor layer on the first metal layer, a threshold voltage of the second N-type transistor is lower than that of the first N-type transistor; and a second P-type transistor formed on the semiconductor substrate, the second P-type transistor containing a fourth gate dielectric film and a fourth gate electrode, the fourth gate dielectric film consisting of a second insulator layer, an aluminum oxide layer on the second insulator layer, and a second high dielectric constant insulator layer on the aluminum oxide layer, the fourth gate electrode consisting of a second metal layer and a second semiconductor layer on the second metal layer, the second high dielectric constant insulator layer being made of the same material as the first high dielectric constant insulator layer and having the same film thickness as the first high dielectric constant insulator layer, the second metal layer being made of the same material as the first metal layer and having the same film thickness as the first metal layer, the second semiconductor layer being made of the same material as the first semiconductor layer and having the same film thickness as the first semiconductor layer, a threshold voltage of the second P-type transistor is lower than that of the first P-type transistor.

DETAILED DESCRIPTION

First Embodiment

Figure 1:
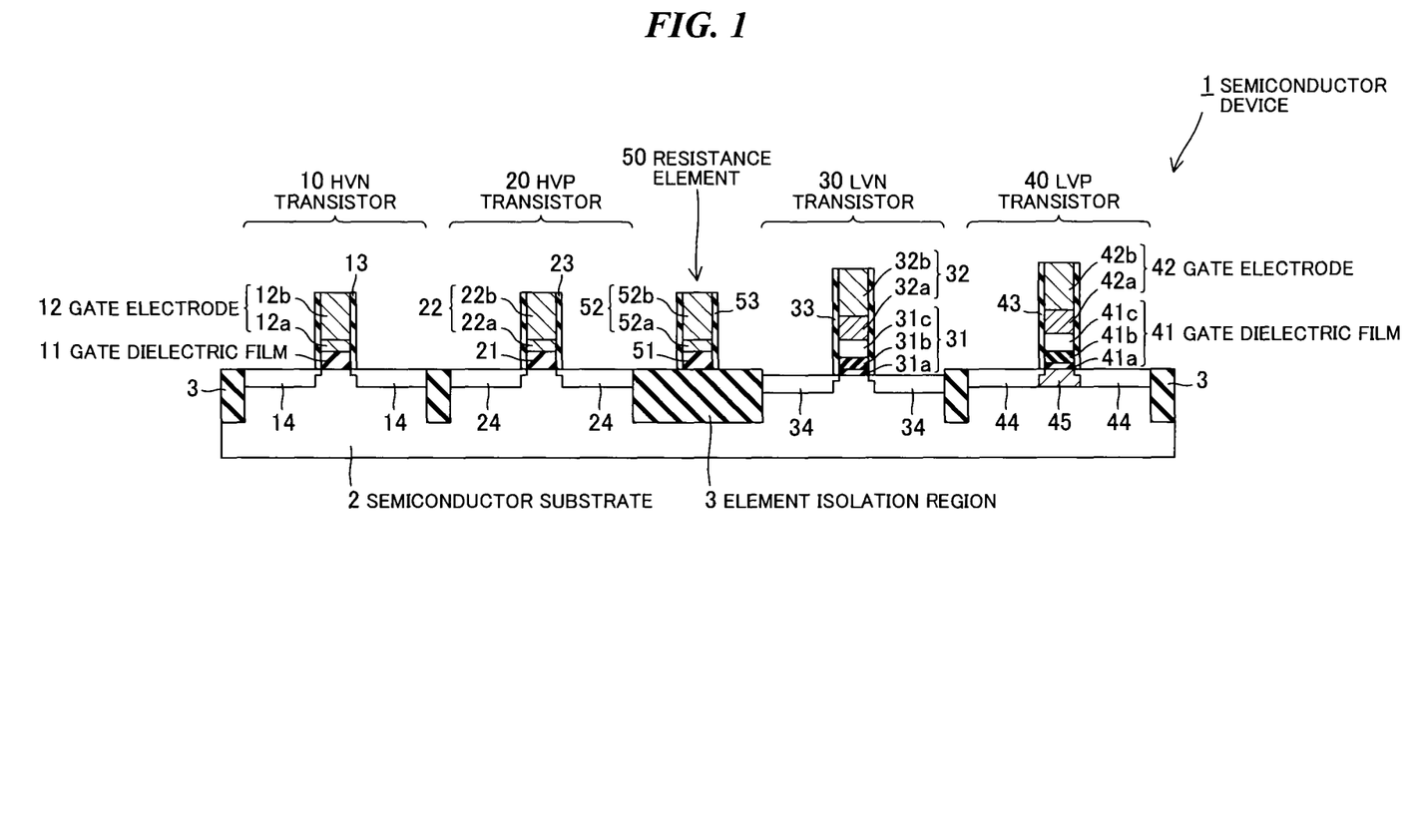
FIG. 1 is a cross sectional view of a semiconductor device according to a first embodiment.

FIG. 1 is a cross sectional view of a semiconductor device 1 according to a first embodiment. The semiconductor device 1 contains an N-type transistor 10 having high operating voltage (hereinafter referred to as an HVN transistor 10), a P-type transistor 20 having high operating voltage (hereinafter referred to as an HVP transistor 20), an N-type transistor 30 having low operating voltage (hereinafter referred to as a LVN transistor 30), a P-type transistor 40 having low operating voltage (hereinafter referred to as a LVP transistor 40), and a resistance element 50.

The HVN transistor 10, the HVP transistor 20, the LVN transistor 30 and the LVP transistor 40 are formed on a semiconductor substrate 2 and electrically isolated each other by an element isolation region 3. The resistance element 50 is formed on the element isolation region 3.

The semiconductor substrate 2 is made of Si-based crystal such as Si crystal, etc.

The element isolation region 3 is made of, e.g., insulating material such as $SiO_2$, etc., and has a STI (Shallow Trench Isolation) structure.

The HVN transistor 10 has a gate dielectric film 11, a gate electrode 12, gate sidewalls 13 and source/drain regions 14. The gate electrode 12 is made of a lower layer 12a and an upper layer 12b.

The HVN transistor 20 has a gate dielectric film 21, a gate electrode 22, gate sidewalls 23 and source/drain regions 24. The gate electrode 22 is made of a lower layer 22a and an upper layer 22b.

The LVN transistor 30 has a gate dielectric film 31, a gate electrode 32, gate sidewalls 33 and source/drain regions 34. The gate dielectric film 31 is made of an insulator layer 31a, a $La_2O_3$ layer 31b on the insulator layer 31a, a high dielectric constant insulator layer 31c on the $La_2O_3$ layer 31b. The gate electrode 32 is made of a metal layer 32a and a semiconductor layer 32b. The LVN transistor 30 has an operating voltage which is lower than that of the HVN transistor 10.

The LVN transistor 40 has a gate dielectric film 41, a gate electrode 42, gate sidewalls 43 and source/drain regions 44. The gate dielectric film 41 is made of an insulator layer 41a, a $Al_2O_3$ layer 41b on the insulator layer 41a, a high dielectric constant insulator layer 41c on the $Al_2O_3$ layer 41b. The gate electrode 42 is made of a metal layer 42a and a semiconductor layer 42b. The LVN transistor 40 has an operating voltage which is lower than that of the HVN transistor 20.

The resistance element 50 has a first layer 51, a second layer 52 on the first layer 51 and sidewalls 53. The second layer 52 is made of a lower layer 52a and an upper layer 52b. For example, the resistance element 50 is an element that functions as middle a resistance element and an electronic fuse, and the second layer 52 is broken when electric current of the magnitude to adversely affect a circuit in the semiconductor device 1 flow in the resistance element 50. Therefore, it is necessary that the second layer 52 has an electrical resistance of enough magnitude to function as an electronic fuse, and the second layer 52 does not contain a layer made of the metal.

The gate dielectric films 11 and 21, the insulator layers 31a and 41a and the first layer 51 are made of insulating material such as $SiO_2$ or SiON. In addition, it is preferable that the gate dielectric films 11 and 21 and the first layer 51 are formed by patterning a same film, and made of a same material. Furthermore, the gate dielectric films 11 and 21 have the same film thickness, and the insulator layers 31a and 41a are thicker than the gate dielectric films 11 and 21.

The lower layers 12a, 22a and 52a, the upper layers 12b, 22b and 52b and the semiconductor layers 32b and 42b are made of crystal consisting mainly of Si such as Si crystal. In addition, it is preferable that the upper layers 12b, 22b and 52b and the semiconductor layers 32b and 42b are formed by patterning a same film, and made of a same material.

The $La_2O_3$ layer 31b has a function to decrease a threshold voltage of an N-type transistor by using it in combination with the high dielectric constant insulator layer 31c. In addition, the $La_2O_3$ layer 31b is formed between the insulator layer 31a and the high dielectric constant insulator layer 31c, and the threshold voltage of the LVN transistor 30 can be more decreased in this case than in the case in which the $La_2O_3$ layer 31b is formed under the insulator layer 31a.

The $Al_2O_3$ layer 41b has a function to decrease a threshold voltage of a P-type transistor by using it in combination with the high dielectric constant insulator layer 41c. In addition, the $Al_2O_3$ layer 41b is formed between the insulator layer 41a and the high dielectric constant insulator layer 41c, and the threshold voltage of the LVP transistor 40 can be more decreased in this case than in the case in which the $Al_2O_3$ layer 41b is formed under the insulator layer 41a.

The high dielectric constant insulator layers 31c and 41c are made of high dielectric constant material such as $HfO_2$, HfON, HfSiO, HfSiON, $ZrO_2$, ZrON, ZrSiO, ZrSiON, HfZrO, HfZrON, HfZrSiO or HfZrSiON. In addition, it is preferable that the high dielectric constant insulator layers 31c and 41c are formed by patterning a same film, and made of a same material. The use of the high dielectric constant insulator layers 31c and 41c can increase the physical film thickness of the gate dielectric films 31 and 41 to suppress generation of gate leakage current, and decrease the electric film thickness of them.

The metal layers 32a and 42a are made of metal such as TiN, MoN, TaC, WN or TiAlN. In addition, the metal layers 32a and 42a are made of a same material. Although the electric film thickness of the gate dielectric films 31 and 41 is less than that of the gate dielectric films 11 and 21, depletion of the gate electrodes 32 and 42 can be prevented by using the metal layers 32a and 42a.

The gate sidewalls 13, 23, 33 and 43 and the sidewalls 53 are made of insulating film such as SiN or $SiO_2$, or a laminated structure thereof.

The source/drain regions 14 and 34 are formed by implanting N-type impurities such as As or P into the HVN transistor 10 and the LVN transistor 30 in the semiconductor substrate 2. In addition, the source/drain regions 24 and 44 are formed by implanting P-type impurities such as B or $BF_2$ into the HVP transistor 20 and the LVP transistor 40 in the semiconductor substrate 2.

In addition, the LVP transistor 40 is formed on a SiGe crystal layer 45. Therefore, since a channel region of the LVP transistor 40 is formed in the SiGe crystal layer 45, the threshold voltage of the LVP transistor 40 can be further decreased.

In the semiconductor device 1 according to the first embodiment, the expanse of the inversion film thickness of the HVN transistor 10 and the HVP transistor 20 can be prevented because the gate dielectric films 11 and 21 have the same film thickness.

An example of processes for fabricating the semiconductor device 1 according to this embodiment will be described hereinafter.

FIGS. 2A to 2K are cross sectional views showing processes for fabricating the semiconductor device 1 according to the first embodiment.

Figure 2A:
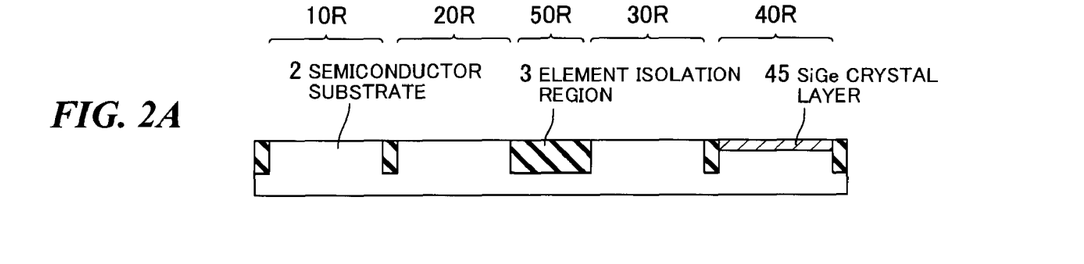
FIGS. 2A to 2K are cross sectional views showing processes for fabricating the semiconductor device according to the first embodiment.

Firstly, as shown in FIG. 2A, an HVN transistor region 10R for forming the HVN transistor 10, an HVP transistor region 20R for forming the HVP transistor 20, a LVN transistor region 30R for forming the LVN transistor 30, and a LVP transistor region 40R for forming the LVP transistor 40 are laid out on the semiconductor substrate 2 by forming the element isolation region 3 in semiconductor substrate 2, and then the SiGe crystal layer 45 is formed in the LVP transistor region 40R on the surface of the semiconductor substrate 2. Note that, a Si crystal film of thickness 0.5-3 nm may be epitaxially grown on SiGe crystal layer 45.

In addition, in the present embodiment, a region on the element isolation region 3 between the HVP transistor region 20R and the LVN transistor region 30R is used as a resistance element region 50R for forming the resistance element 50.

Here, the element isolation region 3 is formed by, e.g., following process. Firstly, a trench is formed in the semiconductor substrate 2 by photolithography method and RIE (Reactive Ion Etching) method. Next, a $SiO_2$ film is deposited in the trench by coating method or CVD (Chemical Vapor Deposition) method, and is substantially planarized by CMP (Chemical Mechanical Polishing) method, thereby processing into the element isolation region 3.

In addition, although it is not shown in the figures, after the element isolation region 3 is formed, conductivity type impurities are implanted into the semiconductor substrate 2 by ion implantation procedure for forming a well (not shown) in each of the HVN transistor region 10R, the HVP transistor 20R, the LVN transistor region 30R and the LVP transistor region 40R. Here, for forming the wells, n-type impurities such as P are implanted into the HVN transistor region 10R and the LVN transistor region 30R, and p-type impurities such as B are implanted into the HVP transistor 20R and the LVP transistor region 40R. The conductivity type impurities in the wells are activated by heat treatment such as RTA (Rapid Thermal Annealing) method.

In addition, the SiGe crystal layer 45 is formed by, e.g., following process. Firstly, the height of the surface of semiconductor substrate 2 in LVP transistor region 40R is lowered by etching. After that, a SiGe crystal is epitaxially grown using the surface of the semiconductor substrate 2 of which the height has been lowered as base, the SiGe crystals 45 is thereby obtained.

Figure 2B:
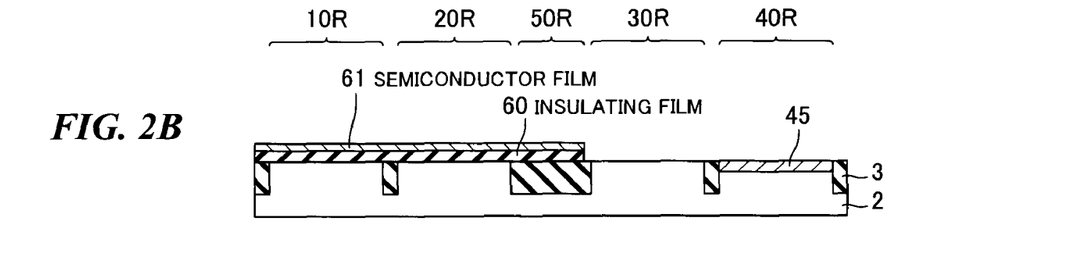

Next, as shown in FIG. 2B, an insulating film 60 and a semiconductor film 61 are formed on the semiconductor substrate 2 and the element isolation region 3 in the HVN transistor region 10R, the HVP transistor 20R and the resistance element region 50R.

Here, the insulating film 60 and the semiconductor film 61 are formed on the semiconductor substrate 2 by CVD method, and then a portion thereof which is formed in a region other than the HVN transistor region 10R, the HVP transistor 20R and the resistance element region 50R is selectively removed by photolithography method. The insulating film 60 is a film to be shaped into the gate dielectric films 11 and 21 and the first layer 51 in a posterior process. In addition, the semiconductor film 61 is a film to be shaped into the lower layers 12a, 22a and 52a in a posterior process.

In addition, it is preferable that the semiconductor film 61 not less than 1 nm in thickness is formed to suppress generation of pinhole. Furthermore, it is preferable that the semi-conductor film 61 not more than 40 nm, particularly not more than 20 nm, in thickness is formed to ensure processability. Moreover, the semiconductor film 61 at the time it is formed may be amorphous or polycrystalline.

Figure 2C:
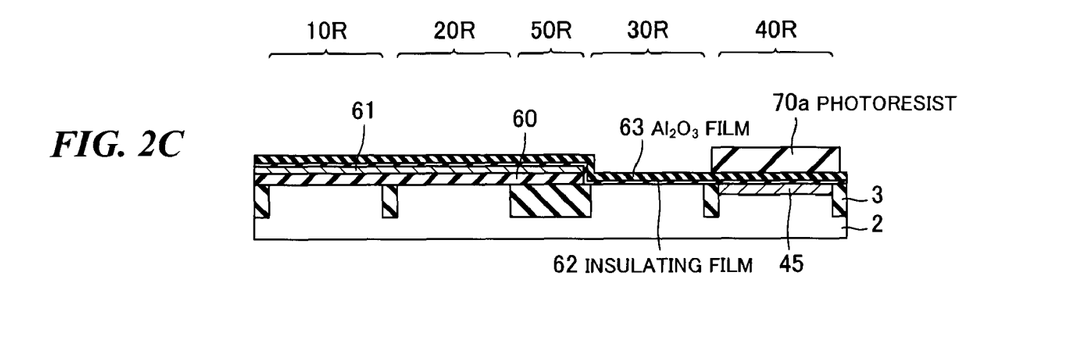

Next, as shown in FIG. 2C, an insulating film 62 and an $Al_2O_3$ film 63 is formed on the semiconductor substrate 2 and the semiconductor film 61 in the LVN transistor region 30R and the LVP transistor region 40R. Furthermore, a photoresist 70a is formed on the $Al_2O_3$ film 63 in the LVP transistor region 40R by photolithography method.

Here, the insulating film 62 is formed by CVD method or oxidation treatment, etc. For example, an Al film 0.2-1.5 nm in thickness is formed by the PVD methods, etc., and then the Al film is exposed to the atmosphere, thereby forming the $Al_2O_3$ film 63.

The insulating film 62 is a film to be shaped into the insulator layer 41a in a posterior process. In addition, the $Al_2O_3$ film 63 is a film to be shaped into the $Al_2O_3$ layer 41b in a posterior process.

Figure 2D:
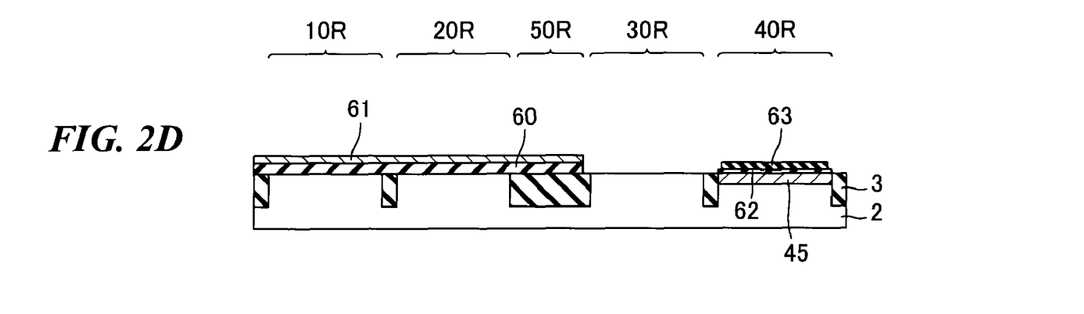

Next, as shown in FIG. 2D, the $Al_2O_3$ film 63 and the insulating film 62 are etched using the photoresist 70a as an etching mask, removing a portion thereof located in the region other than the LVP transistor region 40R. For example, alkali chemical solution such as $NH_4OH/H_2O_2$ mixture is used for etching of the $Al_2O_3$ film 63. Note that, there is no risk of etching the insulating film 60 when the $Al_2O_3$ film 63 is etched because the semiconductor film 61 has been placed on the insulating film 60. In addition, the insulating film 62 in the LVN transistor region 30R may not be removed. After the etching of the $Al_2O_3$ film 63, the remaining photoresist 70a is ashed using hydrogen, etc., and then removed.

Figure 2E:
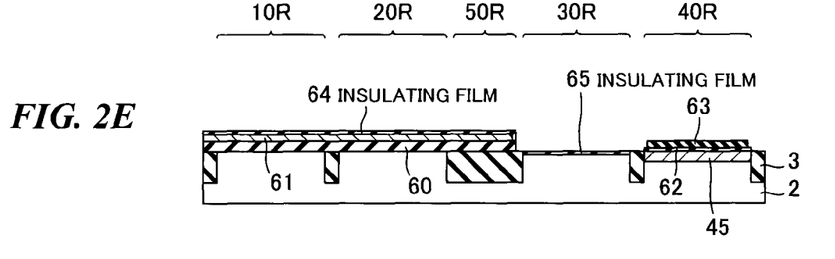

Next, as shown in FIG. 2E, the surface of semiconductor substrate 2 in the LVN transistor region 30R is subjected to wet process using $O_3$ water or $H_2O_3$ water, etc., and oxidation treatment by heat treatment in oxidation atmosphere, forming an insulating film 65 made of $SiO_2$. Note that, as shown in FIG. 2E, an insulating film 64 may be formed on the surface of the semiconductor film 61 in this process.

Here, the insulating film 65 is a film to be shaped into the insulator layer 31a in a posterior process.

Figure 2F:
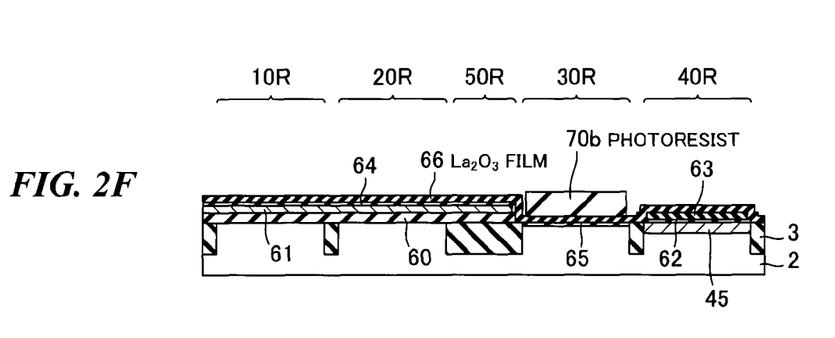

Next, as shown in FIG. 2F, a $La_2O_3$ film 66 is formed on the insulating film 64, the insulating film 65 and the $Al_2O_3$ film 63. Furthermore, a photoresist 70b is formed on the $La_2O_3$ film 66 in the LVN transistor region 30R by photolithography method.

Here, for example, a La film 0.1-1.0 nm, preferably 0.1-0.5 nm, in thickness is formed, and then the La film is exposed to the atmosphere, thereby forming the $La_2O_3$ film 66. The $La_2O_3$ film 66 is a film to be shaped into the $La_2O_3$ layer 31b in a posterior process.

Figure 2G:
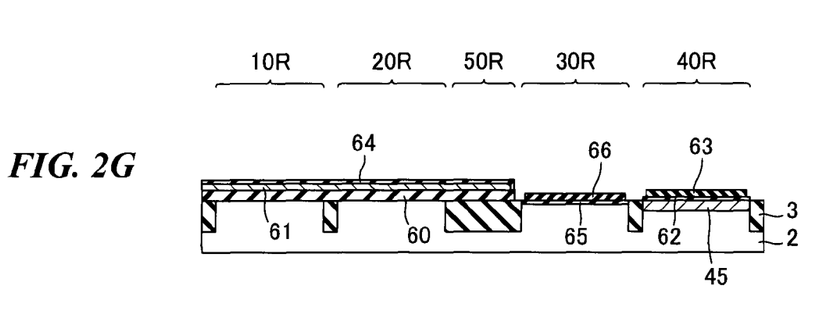

Next, as shown in FIG. 2G, the $La_2O_3$ film 66 is etched using the photoresist 70b as an etching mask, removing a portion thereof located in the region other than the LVN transistor region 30R. For example, dilute HCl solution, etc., is used for etching of the $La_2O_3$ film 66. When the $La_2O_3$ film 66 is etched using dilute HCl solution, there is no risk that the thickness each of the $Al_2O_3$ film 63 and the insulating film 64 is decreased to such a degree that operation of a transistor is adversely affected because enough etching selectivity to the $Al_2O_3$ film 63 and the insulating film 64 can be ensured. After the etching of the $La_2O_3$ film 66, the remaining photoresist 70b is ashed using hydrogen, etc., and then removed.

Note that, the sequence of forming the $La_2O_3$ film 66 in the LVN transistor region 30R and forming the $Al_2O_3$ film 63 in the LVP transistor region 40R may be reversed.

Figure 2H:
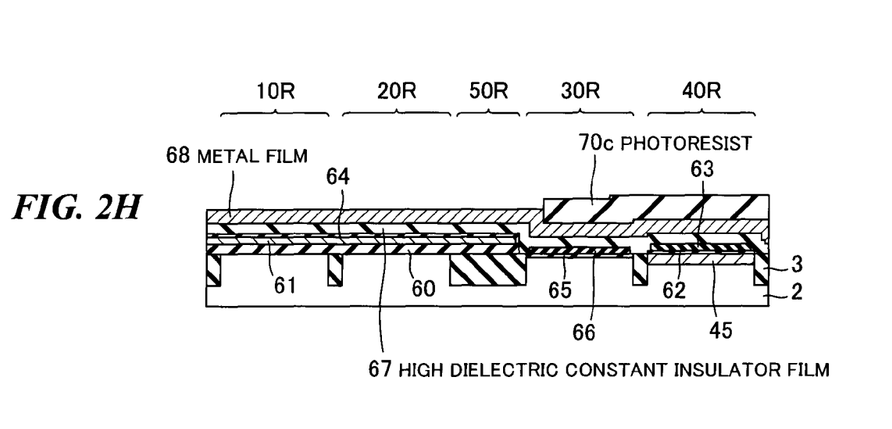

Next, as shown in FIG. 2H, a high dielectric constant insulator film 67 and a metal film 68 are formed on the insulating film 64, the La$_2$O$_3$ film 66 and the Al$_2$O$_3$ film 63. Furthermore, a photoresist 70c is formed on the metal film 68 in the LVN transistor region 30R and the LVP transistor region 40R by photolithography method.

Here, when the high dielectric constant insulator film 67 is made of HfSiON, for example, a HfSiO film is formed by CVD method, etc., and then is subjected to nitriding treatment and heat treatment, thereby forming the high dielectric constant insulator film 67. In addition, the metal film 68 is formed by PVD method, etc. The high dielectric constant insulator film 67 is a film to be shaped into the high dielectric constant insulator layers 31c and 41c in a posterior process. Furthermore, the metal film 68 is a film to be shaped into the metal layers 32a and 42a in a posterior process.

Figure 2I:
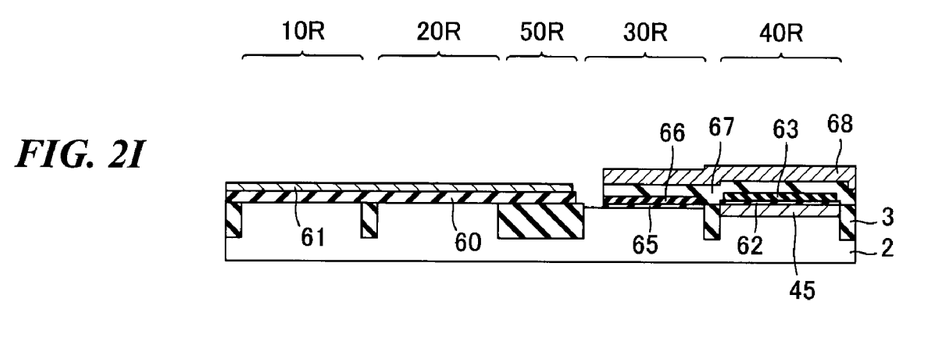

Next, as shown in FIG. 2I, the high dielectric constant insulator film 67 and the metal film 68 are etched using the photoresist 70c as an etching mask, removing a portion thereof located in the region other than the LVN transistor region 30R and the LVP transistor region 40R. In addition, the insulating film 64 also is removed. After the etching of the high dielectric constant insulator film 67, the metal film 68 and the insulating film 64, the remaining photoresist 70c is ashed using hydrogen, etc., and then removed.

Figure 2J:
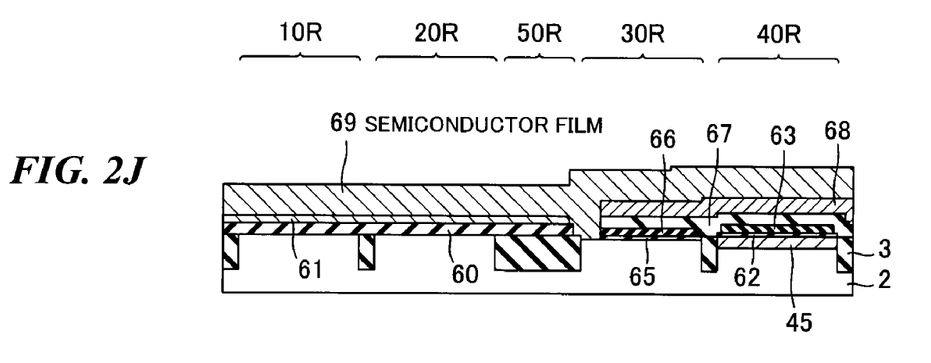

Next, as shown in FIG. 2J, a semiconductor film 69 is formed on the semiconductor film 61 and the metal film 68.

Here, the semiconductor film 69 is formed by CVD method. The semiconductor film 69 is a film to be shaped into the upper layer 12b, 22b and 52b and the semiconductor layer 32b and 42b in a posterior process.

Figure 2K:
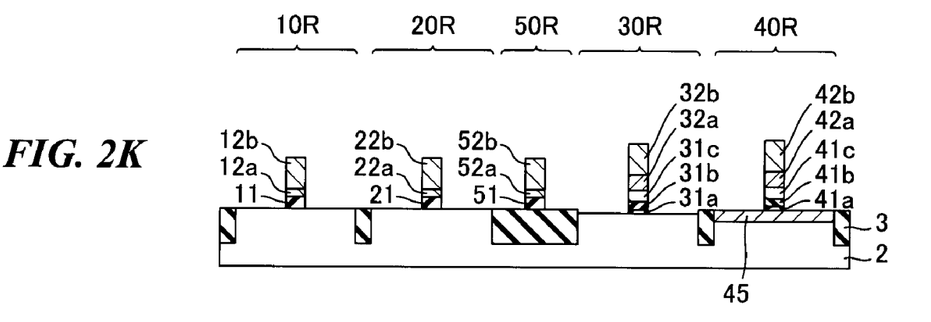

Next, as shown in FIG. 2K, the semiconductor film 69, the semiconductor film 61, the insulating film 60, the metal film 68, the high dielectric constant insulator film 67, the La$_2$O$_3$ film 66, the Al$_2$O$_3$ film 63, the insulating film 65 and the insulating film 62 are patterned. As a result, the gate dielectric film 11, the lower layer 12a and the upper layer 12b in the HVN transistor region 10R; the gate dielectric film 21, the lower layer 22a and the upper layer 22b in the HVP transistor region 20R; the insulator layer 31a, the La$_2$O$_3$ layer 31b, the high dielectric constant insulator layer 31c, the metal layer 32a and the semiconductor layer 32b in the LVN transistor region 30R; the insulator layer 41a, the Al$_2$O$_3$ layer 41b, the high dielectric constant insulator layer 41c, the metal layer 42a and the semiconductor layer 42b in the LVP transistor region 40R; and the first layer 51, the lower layer 52a and the upper layer 52b in the resistance element region 50R are formed.

After that, the source/drain regions 14, 24, 34 and 44 are formed by ion implantation procedure, etc., and the gate sidewalls 13, 23, 33 and 43 and the sidewalls 53 are formed by CVD method and RIE method, etc., obtaining the semiconductor device 1 shown in FIG. 1.

Note that, metal silicide layers may be formed in the upper portions of the source/drain regions 14, 24, 34 and 44, the upper layer 12b and 22b and the semiconductor layers 32b and 42b. Note that, a metal silicide layer is not formed in the upper portion of the upper layer 52b in order not to decrease the electrical resistance of the resistance element 50.

Effect of the First Embodiment

According to the first embodiment, depletion of the gate electrodes 32 and 42 can be prevented by using the metal layers 32a and 42a that function as metal gate electrodes. On the other hand, the resistance element 50 has an electrical resistance of enough magnitude to function as an electronic fuse because it does not contain a layer made of the metal.

In addition, there is no risk of etching the insulating film 65 when the Al$_2$O$_3$ film 63 is patterned because the insulating film 65 in the LVN transistor region 30R is formed after the patterning of the Al$_2$O$_3$ film 63 in the LVP transistor region 40R. Therefore, the insulator layer 31a of the gate dielectric film 31 can be prevented from being thinned. As a result, the film thickness of the insulator layer 31a can be almost equalized with that of the insulator layer 41a.

In addition, there is no risk that the insulating film 60 is etched and thereby thinned when the Al$_2$O$_3$ film 63 is patterned because the semiconductor film 61 has been placed on the insulating film 60. As a result, the gate dielectric films 11 and 21 can be prevented from being thinned.

Due to the effects mentioned above, it is possible to each set suitable threshold voltage to the HVN transistor 10, the HVP transistor 20, the LVN transistor 30 and the LVP transistor 40, and set suitable electrical resistance to the resistance element 50 which functions as a fuse.

Second Embodiment

The second embodiment is different from the first embodiment in that a hard mask, as well as the photoresist 70a, is used as an etching mask for patterning of the Al$_2$O$_3$ film 63 of the semiconductor device 1.

For example, alkali chemical solution such as NH$_4$OH/H$_2$O$_2$ mixture is used for etching of the Al$_2$O$_3$ film 63. However, the photoresist 70a may be etched and thereby shrunk—in other words, the pattern edge of the photoresist 70a may retreat—during the etching of the Al$_2$O$_3$ film 63 because resistance against alkali chemical solution of the photoresist 70a is not so high. When the photoresist 70a shrinks during the etching, a pattern formed into the Al$_2$O$_3$ film 63 shrinks, and therefore a width or a thickness of the Al$_2$O$_3$ film 63 required to form the Al$_2$O$_3$ layer 41b may not be ensured. Thus, in the present embodiment, the Al$_2$O$_3$ film 63 having a desired size is formed by patterning using a hard mask, as well as the photoresist 70a, as an etching mask.

Note that, the explanation will be omitted or simplified for the same points as the first embodiment.

FIGS. 3A to 3D are cross sectional views showing processes for fabricating the semiconductor device 1 according to the second embodiment.

Firstly, the processes until forming the Al$_2$O$_3$ film 63, shown in FIGS. 2A to 2C, are carried out in the same way as the first embodiment.

Figure 3A:
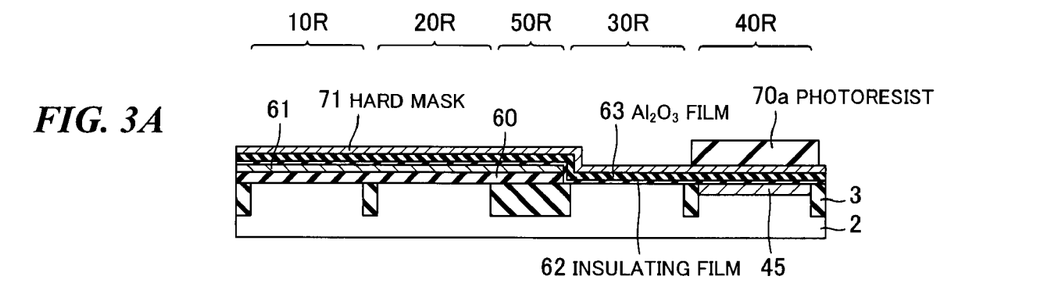
FIGS. 3A to 3D are cross sectional views showing processes for fabricating a semiconductor device according to the second embodiment.

Next, as shown in FIG. 3A, a hard mask 71 is formed on the Al$_2$O$_3$ film 63, and then the photoresist 70a is formed on the Al$_2$O$_3$ film 63 in the LVP transistor region 40R by photolithography method.

Here, the hard mask 71 is made of a material of which enough etching selectivity to the Al$_2$O$_3$ film 63 can be ensured, for example, metal such as TiN. The hard mask 71 may be a film made of a material which is the same as that of the metal film 68. In addition, the hard mask 71 is formed by PVD method.

Figure 3B:
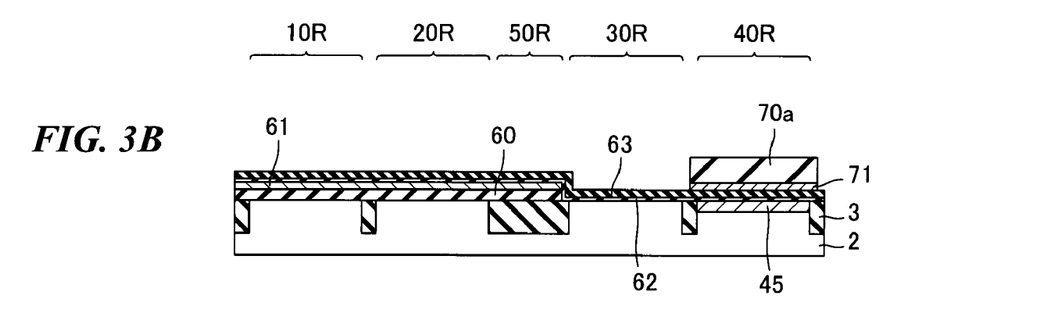

Next, as shown in FIG. 3B, the hard mask 71 is etched using the photoresist 70a as an etching mask, removing a portion thereof located in the region other than the LVP transistor region 40R.

Figure 3C:
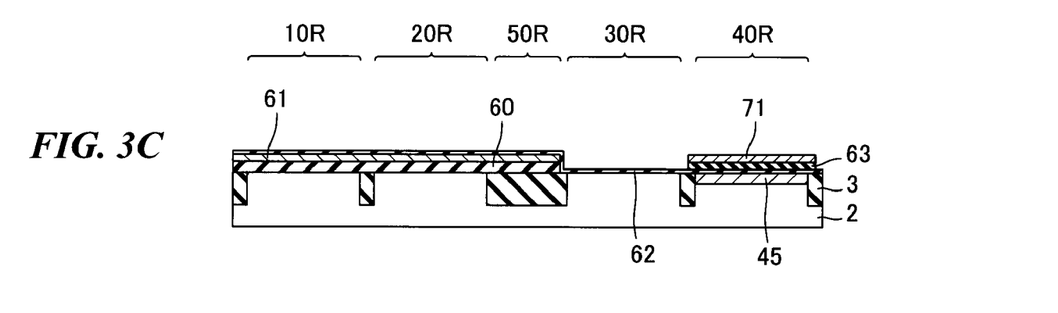

Next, as shown in FIG. 3C, the Al$_2$O$_3$ film 63 is etched using the photoresist 70a and the hard mask 71 as an etching mask, removing a portion thereof located in the region other than the LVP transistor region 40R.

Here, as shown in FIG. 3C, even if the photoresist 70a is etched and thereby vanished during the etching of the Al$_2$O$_3$ film 63, the Al$_2$O$_3$ film 63 having a desired size is formed by patterning because the hard mask 71 functions as an etching mask.

Figure 3D:
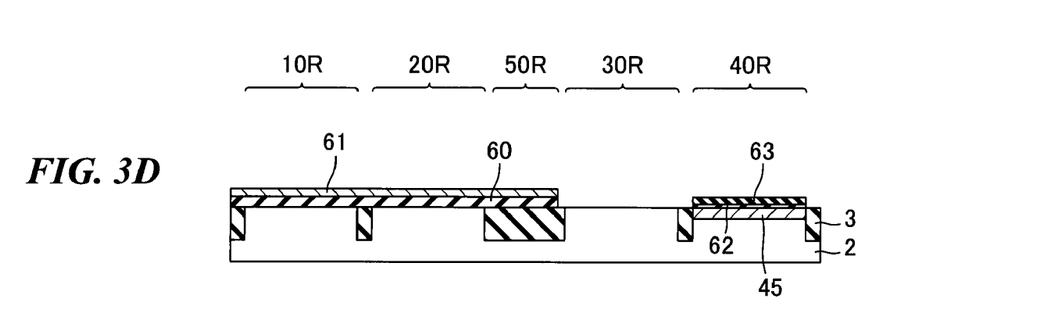

Next, as shown in FIG. 3D, the insulating film 62 is etched using the hard mask 71 as an etching mask, removing a portion thereof located in the region other than the LVP transistor region 40R, and then the hard mask 71 is removed. Note that, the insulating film 62 in the LVN transistor region 30R may not be removed.

Subsequently, the process shown in FIG. 2E and the subsequent processes are carried out in the same way as the first embodiment, the semiconductor device 1 is thereby obtained.

Other Embodiments

It should be noted that the present invention is not intended to be limited to the above-mentioned first and second embodiments, and the various kinds of changes thereof can be implemented by those skilled in the art without departing from the gist of the invention. In addition, the constituent elements of the above-mentioned embodiments can be arbitrarily combined with each other without departing from the gist of the invention.

What is claimed is:

1. A semiconductor device, comprising:
   a first N-type transistor formed on a semiconductor substrate, the first N-type transistor containing a first gate dielectric film and a first gate electrode;
   a first P-type transistor formed on the semiconductor substrate, the first P-type transistor containing a second gate dielectric film and a second gate electrode, the second gate dielectric film being made of the same material as the first gate dielectric film and having the same film thickness as the first gate dielectric film, the second gate electrode being made of the same material as the first gate electrode and having the same film thickness as the first gate electrode;
   a second N-type transistor formed on the semiconductor substrate, the second N-type transistor containing a third gate dielectric film and a third gate electrode, the third gate dielectric film consisting of a first insulator layer, a lanthanum oxide layer on the first insulator layer, and a first high dielectric constant insulator layer on the lanthanum oxide layer, the third gate electrode consisting of a first metal layer and a first semiconductor layer on the first metal layer, a threshold voltage of the second N-type transistor is lower than that of the first N-type transistor; and
   a second P-type transistor formed on the semiconductor substrate, the second P-type transistor containing a fourth gate dielectric film and a fourth gate electrode, the fourth gate dielectric film consisting of a second insulator layer, an aluminum oxide layer on the second insulator layer, and a second high dielectric constant insulator layer on the aluminum oxide layer, the fourth gate electrode consisting of a second metal layer and a second semiconductor layer on the second metal layer, the second high dielectric constant insulator layer being made of the same material as the first high dielectric constant insulator layer and having the same film thickness as the first high dielectric constant insulator layer, the second metal layer being made of the same material as the first metal layer and having the same film thickness as the first metal layer, the second semiconductor layer being made of the same material as the first semiconductor layer and having the same film thickness as the first semiconductor layer, a threshold voltage of the second P-type transistor is lower than that of the first P-type transistor.

2. The semiconductor device according to claim 1, further comprising:
   a resistance element containing a lower layer and a upper layer, the lower layer being made of the same material as the first gate dielectric film and having the same film thickness as the first gate dielectric film, the upper layer being made of the same material as the first gate electrode and having the same film thickness as the first gate electrode.

3. The semiconductor device according to claim 2, wherein film thicknesses of both the first insulator layer and the second insulator layer are less than a film thickness of the first gate dielectric film.

4. The semiconductor device according to claim 2, wherein the first gate dielectric film contains an upper semiconductor layer and a lower semiconductor layer, the upper semiconductor layer being made of the same material as the first semiconductor layer.

5. The semiconductor device according to claim 2, wherein the first high dielectric constant insulator layer is made of HfO$_2$, HfON, HfSiO, HfSiON, ZrO$_2$, ZrON, ZrSiO, ZrSiON, HfZrO, HfZrON, HfZrSiO or HfZrSiON.

6. The semiconductor device according to claim 1, wherein film thicknesses of both the first insulator layer and the second insulator layer are less than a film thickness of the first gate dielectric film.

7. The semiconductor device according to claim 1, wherein the first gate dielectric film contains an upper semiconductor layer and a lower semiconductor layer, the upper semiconductor layer being made of the same material as the first semiconductor layer.

8. The semiconductor device according to claim 1, wherein the first high dielectric constant insulator layer is made of HfO$_2$, HfON, HfSiO, HfSiON, ZrO$_2$, ZrON, ZrSiO, ZrSiON, HfZrO, HfZrON, HfZrSiO or HfZrSiON.

* * * * *